US012490542B2

(12) United States Patent
Li et al.

(10) Patent No.: US 12,490,542 B2
(45) Date of Patent: Dec. 2, 2025

(54) PREPARATION METHOD FOR GROWING GERMANIUM SULFIDE ($GeS_2$) SINGLE-CRYSTAL THIN FILM ON $SiO_2$ SUBSTRATE

(71) Applicant: SOUTH CHINA UNIVERSITY OF TECHNOLOGY, Guangzhou (CN)

(72) Inventors: Guoqiang Li, Guangzhou (CN); Sheng Chen, Guangzhou (CN); Wenliang Wang, Guangzhou (CN); Jixing Chai, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 137 days.

(21) Appl. No.: 18/276,887

(22) PCT Filed: Dec. 30, 2021

(86) PCT No.: PCT/CN2021/143380
§ 371 (c)(1),
(2) Date: Aug. 11, 2023

(87) PCT Pub. No.: WO2023/050628
PCT Pub. Date: Apr. 6, 2023

(65) Prior Publication Data

US 2024/0120431 A1 Apr. 11, 2024

(30) Foreign Application Priority Data

Sep. 30, 2021 (CN) .......................... 202111157718.8

(51) Int. Cl.
*C30B 25/04* (2006.01)
*C30B 25/18* (2006.01)
(Continued)

(52) U.S. Cl.
CPC ............ *H10F 71/00* (2025.01); *C30B 25/04* (2013.01); *C30B 25/186* (2013.01); *C30B 29/46* (2013.01); *H10F 77/127* (2025.01)

(58) Field of Classification Search
CPC ....... C30B 23/025; C30B 25/02; C30B 25/04; C30B 25/186; C30B 29/08; C30B 29/46; H10F 71/00; H10F 77/127; H10F 77/169
See application file for complete search history.

(56) References Cited

U.S. PATENT DOCUMENTS

2002/0144643 A1 10/2002 Nishinaga et al.
2003/0022395 A1* 1/2003 Olds .................... C30B 29/403 257/E21.59
(Continued)

FOREIGN PATENT DOCUMENTS

CN 111430221 A 7/2020
CN 113972299 A 1/2022
(Continued)

*Primary Examiner* — Jaehwan Oh
(74) *Attorney, Agent, or Firm* — Bayramoglu Law Offices LLC

(57) ABSTRACT

A preparation method for growing a germanium sulfide ($GeS_2$) single-crystal thin film on a $SiO_2$ substrate includes: cleaning a surface of a substrate with acetone, ethanol and deionized water, where the substrate is a Si/$SiO_2$ substrate or a $SiO_2$ glass substrate; photoetching the substrate, spin-coating a photoresist, and performing photoetching and dry etching or wet etching to obtain a groove pattern; depositing a germanium (Ge)-crystal layer in the groove pattern of the substrate to obtain a treated substrate; and putting the treated substrate into a chemical vapor deposition (CVD) device for growth, a growth source being high-purity sulfur (S) powder and high-purity Ge powder, thereby obtaining a $GeS_2$ single-crystal thin film on the $SiO_2$ substrate. The preparation
(Continued)

method can grow $GeS_2$ single crystals on the $SiO_2$ substrate. The $GeS_2$ single crystals have a high crystalline quality and a small surface roughness.

10 Claims, 3 Drawing Sheets

(51) Int. Cl.

| | |
|---|---|
| ***C30B 29/46*** | (2006.01) |
| ***H10F 71/00*** | (2025.01) |
| ***H10F 77/12*** | (2025.01) |

(56) References Cited

U.S. PATENT DOCUMENTS

2003/0089921 A1* 5/2003 Jordan ................ H10F 71/1257
257/E21.12
2018/0138353 A1* 5/2018 Santos Rodriguez .......................
H10F 71/129

FOREIGN PATENT DOCUMENTS

EP 0307109 A1 3/1989
WO 2013099180 A1 7/2013

* cited by examiner

PREPARATION METHOD FOR GROWING GERMANIUM SULFIDE ($GeS_2$) SINGLE-CRYSTAL THIN FILM ON $SiO_2$ SUBSTRATE

CROSS REFERENCE TO THE RELATED APPLICATIONS

This application is the national phase entry of International Application No. PCT/CN2021/143380, filed on Dec. 30, 2021, which is based upon and claims priority to Chinese Patent Application No. 202111157718.8, filed on Sep. 30, 2021, the entire contents of which are incorporated herein by reference.

TECHNICAL FIELD

The present disclosure relates to the technical field of growth of wide-band-gap semiconductor materials for photoelectric detection, and in particular, to a preparation method for growing a germanium sulfide ($GeS_2$) single-crystal thin film on a $SiO_2$ substrate.

BACKGROUND $GeS_2$ is a wide-band-gap and layered in-plane anisotropic group-IV chalcogenide semiconductor. In the monoclinic structure of $GeS_2$, the layered molecules each are composed of tetrahedral basic units, and all layers are bonded by a Van der Waals (VDW) force. For the unique in-plane anisotropic structure, $GeS_2$ shows photoelectric anisotropy and electrically-induced phase transition, and has been widely applied to polarized light detectors, memristors, optical memories, and high-specific-energy batteries. At present, $GeS_2$ crystals are commonly grown by chemical vapor transport (CVT). Specifically, high-purity sulfur (S) powder and high-purity germanium (Ge) powder are molten and sealed in a quartz tube according to a certain proportion, and grown for 24 h at 1,000° C. to obtain $GeS_2$ bulk crystals. This method requires long growth time and obtains large bulk crystals, which are not easily processed to prepare devices.

In order to better apply $GeS_2$ to the devices, and realize monolithic integration with a silicon (Si)-based device, a simple method for growing the $GeS_2$ on a Si-based substrate is desired.

SUMMARY

The present disclosure provides a preparation method for growing a $GeS_2$ single-crystal thin film on a $SiO_2$ substrate, to solve the shortages of the prior art. The preparation method can grow $GeS_2$ single crystals on the $SiO_2$ substrate. The prepared $GeS_2$ single crystals have a high crystalline quality, a small surface roughness, and a corresponding band gap for blue-violet light in a visible light band.

The objective of the present disclosure may be achieved through the following technical solutions:

A preparation method for growing a $GeS_2$ single-crystal thin film on a $SiO_2$ substrate includes:

cleaning a surface of a substrate with acetone, ethanol and deionized water, where the substrate is a Si/$SiO_2$ substrate or a $SiO_2$ glass substrate;

photoetching the substrate, spin-coating a photoresist, and performing photoetching and dry etching or wet etching to obtain a groove pattern;

depositing a Ge-crystal layer in the groove pattern of the substrate to obtain a treated substrate; and putting the treated substrate into a chemical vapor deposition (CVD) device for growth, a growth source being high-purity S powder and high-purity Ge powder, thereby obtaining a $GeS_2$ single-crystal thin film on the $SiO_2$ substrate.

Further, the wet etching includes a buffered oxide etch (BOE) solution or a piranha solution, and the dry etching includes an inductive coupled plasma (ICP) emission spectrometer.

Further, the step of depositing the Ge-crystal layer in the groove pattern of the substrate is implemented by any one of electronic beam evaporation, pulsed laser deposition (PLD), physical sputtering in physical vapor deposition (PVD), the PVD and CVD.

Further, the Si/$SiO_2$ substrate has a p-(100) crystal orientation, and a thickness of 300 nm.

Further, the groove pattern is a circular-hole pattern array.

Further, the high-purity S powder has a purity of 99.999%, and the high-purity Ge powder has a purity of 99.999%.

Further, the step of putting the treated substrate into the CVD device for growth, the growth source being the high-purity S powder and the high-purity Ge powder, thereby obtaining the $GeS_2$ single-crystal thin film on the $SiO_2$ substrate specifically includes:

putting the treated substrate into the CVD device for the growth;

inverting the treated substrate onto a quartz holder, where an alumina crucible with the Ge powder is provided under the treated substrate;

providing a crucible with the S powder at an upstream of a gas path; and obtaining the $GeS_2$ single-crystal thin film on the $SiO_2$ substrate after certain growth time.

Further, an atmosphere of S vapor or hydrogen sulfide gas is used in the growth.

Further, a region for the alumina crucible with the Ge powder has a growth temperature of 800° C., and a heating rate of 15° C./min.

Further, the crucible with the S powder is 8 cm away from the treated substrate, and a region for the crucible with the S powder has a temperature of 200° C., and a heating rate of 5° C./min.

Compared with the prior art, the present disclosure has the following beneficial effects:

1. The preparation method provided by the present disclosure can directly grow the $GeS_2$ single-crystal thin film on the substrate. This is beneficial for monolithic integration with a Si-based device.

2. With a plasma-enhanced CVD (PE-CVD) device, the present disclosure can prepare dozens of $GeS_2$ single-crystal thin films on the $SiO_2$ substrate at a time. Moreover, the PE-CVD device promotes low-temperature cracking of the source, and can reduce a growth temperature of the $GeS_2$ single-crystal thin film.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description show some embodiments of the present disclosure, and those of ordinary skill in the art may still derive other drawings from these drawings without creative efforts.

In the figures: 01—Si substrate layer, 02—$Si_2$ substrate layer, 03—patterned substrate, 04—Ge-crystal seed layer, 05—PE-CVD device, and 06—$GeS_2$ single-crystal layer.

DETAILED DESCRIPTION OF THE EMBODIMENTS

To make objectives, technical solutions and advantages in the embodiments of the present disclosure clearer, the technical solutions in the embodiments of the present disclosure are clearly and completely described below with reference to the accompanying drawings in the embodiments of the present disclosure. Apparently, the described embodiments are merely a part rather than all of the embodiments of the present disclosure. All other embodiments derived from the embodiments in the present disclosure by a person of ordinary skill in the art without creative efforts should fall within the protection scope of the present disclosure. It should be understood that the specific embodiments described herein are merely used to explain the present disclosure, rather than to limit the present disclosure.

EMBODIMENT

The embodiment provides a preparation method for growing a $GeS_2$ single-crystal thin film on a $SiO_2$ substrate. The present disclosure can obtain the high-quality $GeS_2$ single-crystal thin film with a thickness of about 1 μm on the amorphous substrate. The prepared single-crystal thin film has a good crystalline quality and a flat surface, with a roughness only being a few tenths of a nanometer. Through test with PL spectroscopy, two luminous peaks are provided at wavelengths of 410 nm and 445 nm in a blue-violet band. This indicates that the single-crystal thin film is potential for application in visible light detection.

The preparation method for growing a $GeS_2$ single-crystal thin film on a $SiO_2$ substrate provided by the embodiment includes the following steps:

(1) Preferably, a Si/$SiO_2$ substrate with a p-(100) crystal orientation, and a thickness of 300 nm is selected.

(2) A surface of the substrate is cleaned with acetone, ethanol and deionized water.

Figure 1:
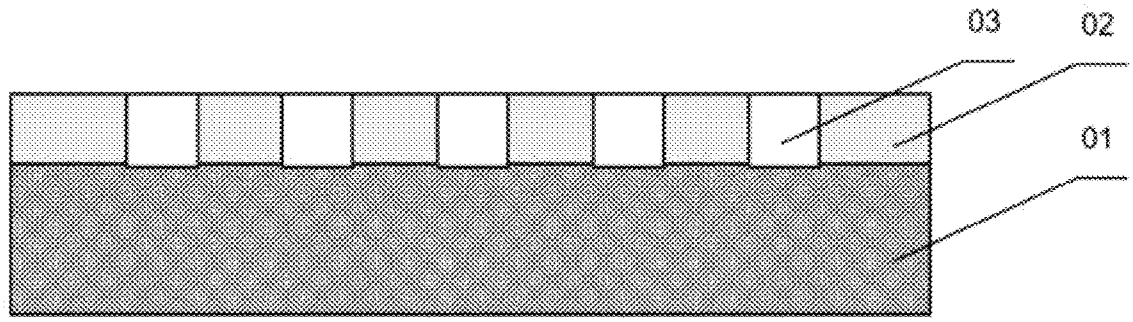
FIG. 1 is a cross-sectional view after a pattern is etched on a Si/$SiO_2$ substrate according to an embodiment of the present disclosure.

(3) As shown in FIG. 1, preferably, the substrate is photoetched, spin-coated with a photoresist, and subjected to exposure and development. The substrate is etched with a circular-hole pattern array having a diameter of 50 μm, dried for 90 s at 110° C., and hardened.

(4) Preferably, a $SiO_2$ layer is etched with an ICP emission spectrometer for 25 s at 10 nm/s, until the Si substrate.

Figure 2:
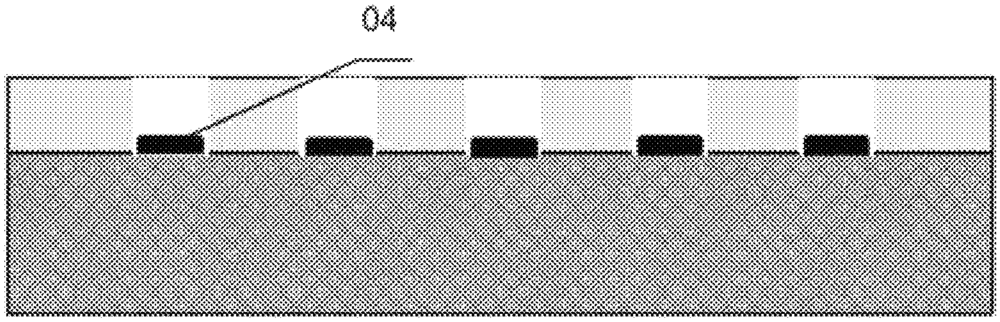
FIG. 2 is a cross-sectional view when a Ge-crystal layer is evaporated on a patterned substrate according to an embodiment of the present disclosure.

(5) As shown in FIG. 2, preferably, Ge single-crystal particles are evaporated by electron beam evaporation. A 20-nm Ge-crystal layer is evaporated on the etched substrate, and then the surface photoresist is cleaned.

Figure 3:
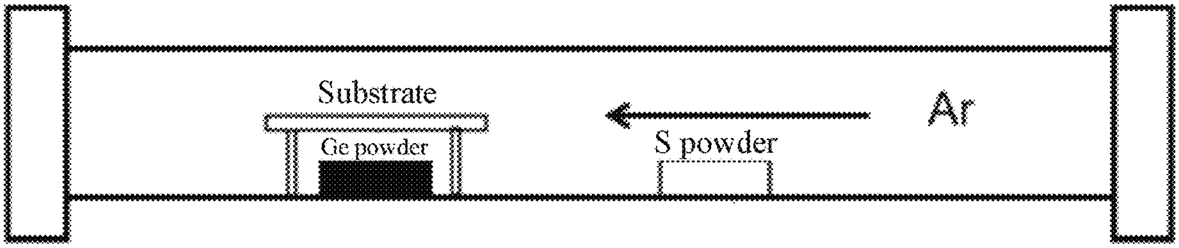
FIG. 3 is a schematic view illustrating growth of a substrate in a PE-CVD device according to an embodiment of the present disclosure.

(6) As shown in FIG. 3, preferably, the substrate is put into a PE-CVD device for growth. High-purity S powder (99.999%) and high-purity Ge powder (99.999%) are taken as a growth source. The substrate is inverted onto a quartz holder. An alumina crucible with the Ge powder is provided under the substrate. A region for the alumina crucible with the Ge powder has a growth temperature of 800° C., and a heating rate of 15° C./min. A crucible with the S powder is provided at an upstream of a gas path, and is 8 cm away from the substrate. A region for the crucible with the S powder has a temperature of 200° C., and a heating rate of 5° C./min. An atmosphere of S vapor or hydrogen sulfide gas is used in the growth. Argon (Ar) is used as a transmission gas. With heat preservation, the growth is performed for 1 h at one atmospheric pressure and at 800° C.

Figure 4:
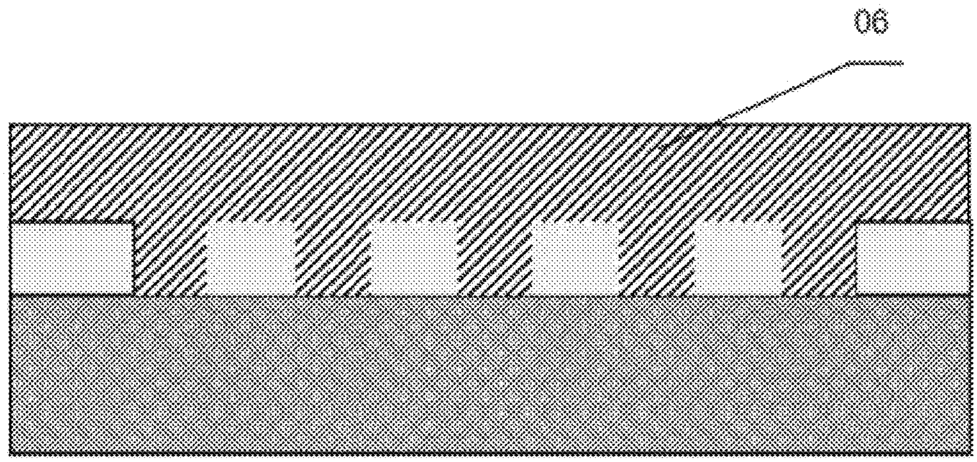
FIG. 4 is a cross-sectional view of a $GeS_2$ single-crystal thin film grown on a $SiO_2$ substrate according to an embodiment of the present disclosure.
Figure 5:
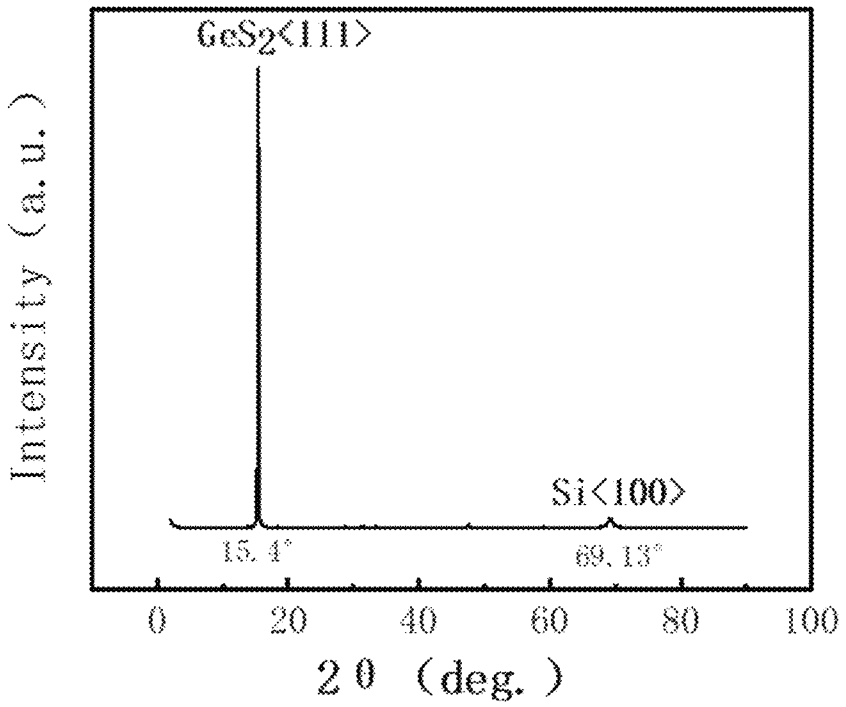
FIG. 5 illustrates an X-ray diffraction (XRD) pattern of a $GeS_2$ single-crystal thin film according to an embodiment of the present disclosure.
Figure 6:
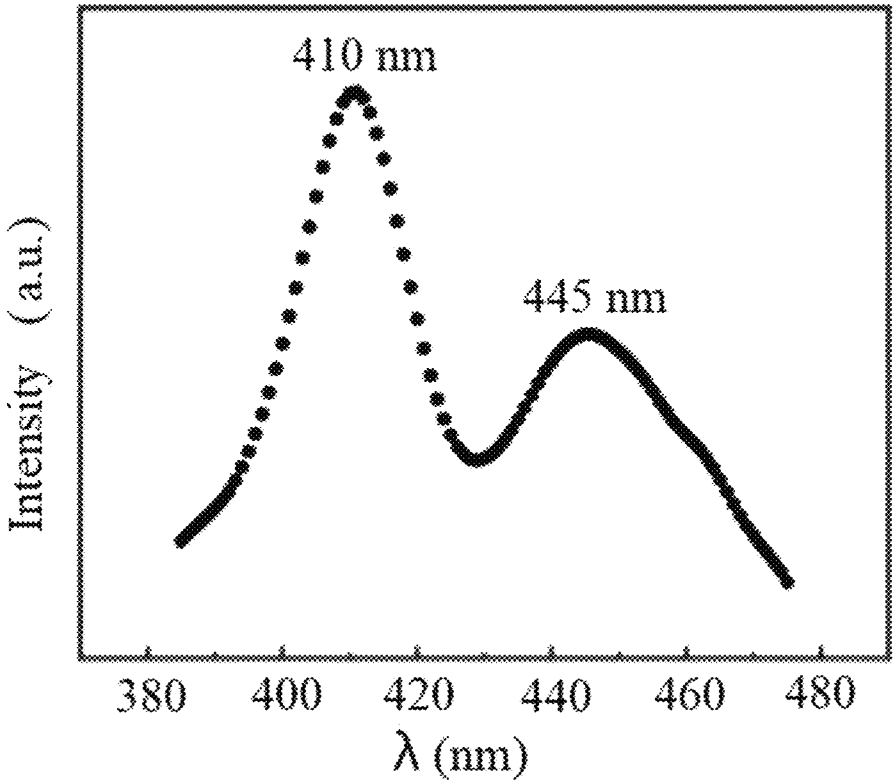
FIG. 6 illustrates a photoluminescence (PL) spectrum of a $GeS_2$ single-crystal thin film according to an embodiment of the present disclosure.

FIG. 4 illustrates a $GeS_2$ single-crystal thin film grown on a $SiO_2$ substrate. FIG. 5 illustrates an XRD pattern of a $GeS_2$ single-crystal thin film. FIG. 6 illustrates a PL spectrum of a $GeS_2$ single-crystal thin film. As can be seen, the prepared $GeS_2$ single-crystal thin film has a good crystalline quality and a flat surface, with a roughness only being a few tenths of a nanometer. Through test with PL spectroscopy, two luminous peaks are provided at wavelengths of 410 nm and 445 nm in a blue-violet band. This indicates that the single-crystal thin film is potential for application in visible light detection.

To sum up, the preparation method provided by the present disclosure includes steps of preprocessing the substrate, evaporating the Ge-crystal layer on the substrate to serve as a nucleating layer, and performing high-temperature sulfuration in the CVD device. The method can prepare the $GeS_2$ single crystal on insulator (SCOI) similar to strained silicon/germanium on insulator (SOUGOI), and can obtain the high-quality $GeS_2$ single-crystal thin film with a thickness of about 1 μm on the amorphous substrate. The prepared $GeS_2$ single-crystal thin film has a good crystalline quality and a flat surface, with a roughness only being a few tenths of a nanometer. Through test with PL spectroscopy, two luminous peaks are provided at wavelengths of 410 nm and 445 nm in a blue-violet band. This indicates that the single-crystal thin film is potential for application in visible light detection.

The above described are merely preferred embodiments of the present disclosure, and the protection scope of the present disclosure is not limited thereto. Any equivalent substitutions or changes made by those skilled in the art according to the technical solutions and concepts of the present disclosure within the technical scope of the present disclosure should fall within the protection scope of the present disclosure.

What is claimed is:

1. A preparation method for growing a germanium sulfide ($GeS_2$) single-crystal thin film on a $SiO_2$ substrate, comprising:

cleaning a surface of a substrate with acetone, ethanol and deionized water, wherein the substrate is a Si/$SiO_2$ substrate or a $SiO_2$ glass substrate;

photoetching the substrate, spin-coating a photoresist, and performing photoetching and dry etching or wet etching to obtain a groove pattern;

depositing a germanium (Ge)-crystal layer in the groove pattern of the substrate to obtain a treated substrate; and putting the treated substrate into a chemical vapor deposition (CVD) device for growth, a growth source being high-purity sulfur(S) powder and high-purity Ge powder, thereby obtaining the $GeS_2$ single-crystal thin film on the $SiO_2$ substrate.

2. The preparation method according to claim 1, wherein the wet etching comprises a buffered oxide etch (BOE) solution or a piranha solution, and the dry etching comprises an inductive coupled plasma (ICP) emission spectrometer.

3. The preparation method according to claim 1, wherein the step of depositing the Ge-crystal layer in the groove pattern of the substrate is implemented by any one of electronic beam evaporation, pulsed laser deposition (PLD), physical sputtering in physical vapor deposition (PVD), the PVD and CVD.

4. The preparation method according to claim 1, wherein the $Si/SiO_2$ substrate has a p-(100) crystal orientation, and a thickness of 300 nm.

5. The preparation method according to claim 1, wherein the groove pattern is a circular-hole pattern array.

6. The preparation method according to claim 1, wherein the high-purity S powder has a purity of 99.999%, and the high-purity Ge powder has a purity of 99.999%.

7. The preparation method according to claim 1, wherein the step of putting the treated substrate into the CVD device for growth, the growth source being the high-purity S powder and the high-purity Ge powder, thereby obtaining the $GeS_2$ single-crystal thin film on the $SiO_2$ substrate comprises:

putting the treated substrate into the CVD device for the growth;

inverting the treated substrate onto a quartz holder, wherein an alumina crucible with the high-purity Ge powder is provided under the treated substrate;

providing a crucible with the high-purity S powder at an upstream of a gas path; and obtaining the $GeS_2$ single-crystal thin film on the $SiO_2$ substrate after certain growth time.

8. The preparation method according to claim 7, wherein an atmosphere of S vapor or hydrogen sulfide gas is used in the growth.

9. The preparation method according to claim 7, wherein a region for the alumina crucible with the high-purity Ge powder has a growth temperature of 800° C., and a heating rate of 15° C./min.

10. The preparation method according to claim 7, wherein the crucible with the high-purity S powder is 8 cm away from the treated substrate, and a region for the crucible with the high-purity S powder has a temperature of 200° C., and a heating rate of 5° C./min.

* * * * *